United States Patent
Garreau et al.

(10) Patent No.: US 8,482,294 B2
(45) Date of Patent: Jul. 9, 2013

(54) DETERMINATION OF AT LEAST ONE VALUE ASSOCIATED WITH THE ELECTROMAGNETIC RADIATION OF AN OBJECT UNDER TEST

(75) Inventors: Philippe Garreau, Paris (FR); Per Iversen, Doylestown, PA (US); Luc Duchesne, Angervilliers (FR); Arnaud Gandois, Breuillet (FR)

(73) Assignee: Microwave Vision, Villebon sur Yvette (FR)

( * ) Notice: Subject to any disclaimer, the term of this patent is extended or adjusted under 35 U.S.C. 154(b) by 316 days.

(21) Appl. No.: 13/001,004

(22) PCT Filed: Jun. 23, 2009

(86) PCT No.: PCT/EP2009/057781
§ 371 (c)(1),
(2), (4) Date: Dec. 22, 2010

(87) PCT Pub. No.: WO2010/006891
PCT Pub. Date: Jan. 21, 2010

(65) Prior Publication Data
US 2011/0121839 A1   May 26, 2011

(30) Foreign Application Priority Data
Jun. 23, 2008 (FR) ...................................... 08 54138

(51) Int. Cl.
*H01F 27/36* (2006.01)

(52) U.S. Cl.
USPC ............................ 324/629; 324/627; 324/501

(58) Field of Classification Search
USPC .......................................... 324/501, 627–629
See application file for complete search history.

(56) References Cited

U.S. PATENT DOCUMENTS

| 5,901,936 A | * | 5/1999 | Bieg .............................. 248/370 |
| 2007/0018654 A1 | * | 1/2007 | Garreau et al. ................ 324/501 |

FOREIGN PATENT DOCUMENTS

| EP | 1 326 070 A1 | 7/2003 |
| FR | 2 858 855 | 2/2005 |
| JP | 05 026930 | 2/1993 |
| JP | 2006 258759 | 9/2006 |

* cited by examiner

*Primary Examiner* — Vincent Q Nguyen
(74) *Attorney, Agent, or Firm* — Blakely Sokoloff Taylor & Zafman

(57) ABSTRACT

A device (300) for the relative positioning of an electromagnetic probe network (100) and of an object being tested (200). The device includes at least a sliding element (301) to provide for the relative sliding of the object being tested (200) or of the electromagnetic probe network (100), to move the object being tested (200) or the probe network (100) along at least one sliding direction included in a plane of the probe network (100), and on which is provided a rotation device (320) for the relative rotation of the object being tested (200) and of the probe network (100) about a main rotation axis perpendicular to the sliding direction.

21 Claims, 4 Drawing Sheets

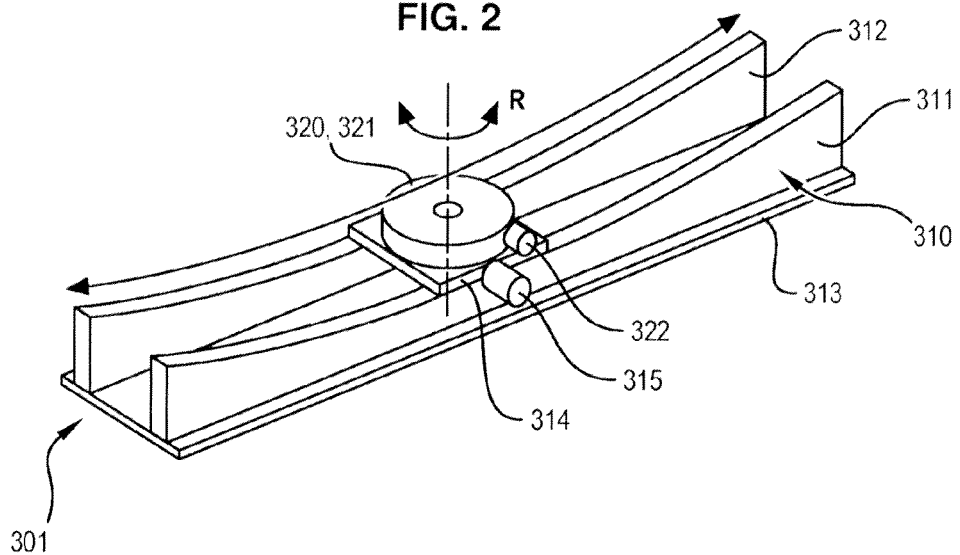
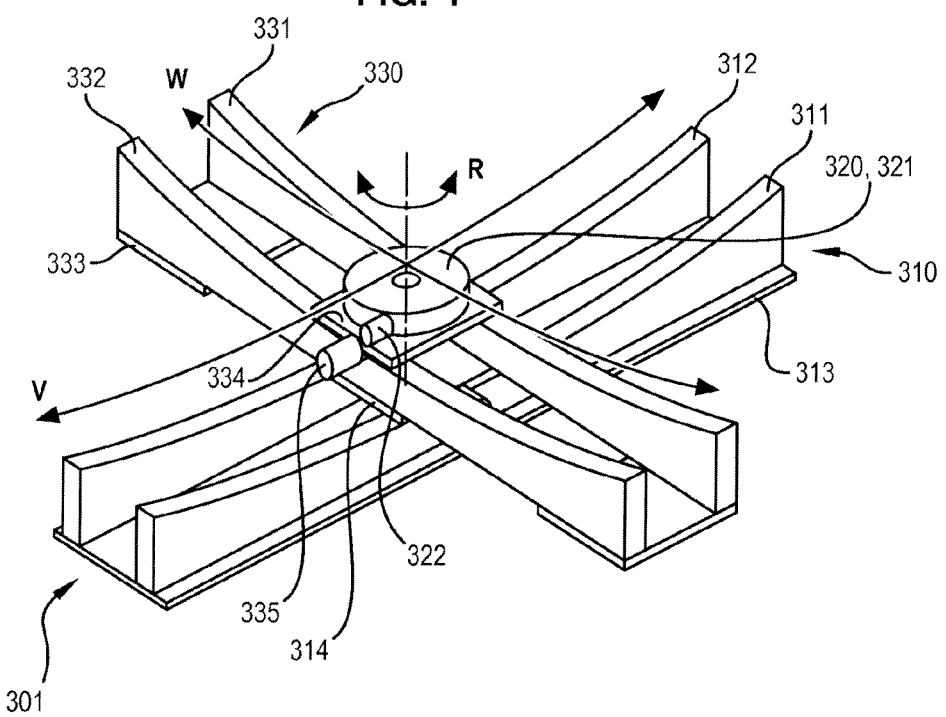

DETERMINATION OF AT LEAST ONE VALUE ASSOCIATED WITH THE ELECTROMAGNETIC RADIATION OF AN OBJECT UNDER TEST

This is a non-provisional application claiming the benefit of International application No. PCT/EP2009/057781 filed Jun. 23, 2009.

The invention concerns the area of devices for determining at least one magnitude associated with the electromagnetic radiation of an object under test.

To determine the radiation diagram of an object being tested, it has already been proposed to use devices in the form of a network of probes distributed over a circular arch, arch portion, sphere, sphere portion (spherical cap) or cylinder portion (cylindrical cap) placed around the object under test or distributed on a line or plane placed in front of the object under test.

Devices of this type are therefore known which comprise means allowing the arch, arch portion, sphere or sphere portion of probes and the object being tested to rotate relative to one another about an axis which corresponds to a diameter of the arch or sphere, so as to measure the radiation of the object under test in successive planes distributed around the relative rotation axis of the arch or sphere and the object under test i.e. over a sphere or sphere portion surrounding the object.

It is also known to use networks of probes in the form of an arch, arch portion or cylinder portion, and to cause relative movement of the object under test perpendicular to the plane of the network of probes, so as to measure radiation over a cylinder or cylinder portion surrounding the object.

It is also known to use networks of probes in line and to cause relative movement of the object under test by rotation about an axis parallel to the probe network, so as to measure radiation over a cylinder surrounding the object.

It is also known to use networks of probes in line or on a plane and to move the object under test over a plane parallel to the network of probes so as to measure radiation on a plane in front of the object.

These devices with a network of probes in the form of an arch, sphere, line or plane, whether used for measurements in spherical coordinates, measurements in cylindrical coordinates or measurements in planar coordinates, have limitations however related to the discrete measurement pitch imposed by the arrangement of the probes in a network.

The number of measurement points needed to measure an antenna at a given frequency is directly related to the size of the radiation source and to the wavelength at the measurement frequency ($\lambda$). For example, for measurements in spherical or cylindrical geometry, there are different sampling criteria to determine the number of measurement points needed along the arch, arch portion, sphere, sphere portion or cylinder portion. The most known is given by the minimum distance $\lambda/2$ between the sampling points on the minimum sphere surrounding the source, a minimum sphere of diameter D and whose centre coincides with the centre of the network. This corresponds to an angular spacing of $\lambda/D$ between the measurement probes of the network. Similarly, for measurements in planar geometry, the sampling criterion is given by the minimum distance $\lambda/2$ between the sampling points on a plane in front of the source. This corresponds to spacing between the measuring probes of the network that is equal to $\lambda/2$.

Therefore the use of a network of probes, whose size, number and spacing of the measuring probes are physically limited, for a given frequency, imposes constraints relating to the dimensions of the object under test whose field is to be measured and, for given dimensions of the object under test, imposes constraints relating to the maximum possible measurement frequency.

To overcome these disadvantages, a device was proposed in the field of measurements using arches of probes, said device comprising means which, by rotation about an axis, allow relative tilting of the probe network and object under test to offset the probe network and object under test at an angle to one another, and thereby allow measurements at several relative angle positions of the probe network and object under test.

In this manner, for each relative position of the probe network and object under test, the number of measurement points is multiplied in the plane of the arch. Therefore for given dimensions of the object to be measured, this allows the maximum possible measuring frequency to be increased. Similarly, for a given measuring frequency, this allows the dimensions of the object under test to be increased as seen in the plane of the arch.

One objective of the invention is to propose a device, for the relative positioning of the probe network and object under test, that is adapted to allow even higher multiplication of the number of sampled measurement points.

Another objective of the invention is to propose a device, for the relative positioning of the probe network and object under test, that allows the field of application of a given probe network to be widened notably in terms of size of object whose radiation diagram can be determined, whilst maintaining unlimited sampling capacity.

A further objective of the present invention is to propose a device, for the relative positioning of a probe network and object under test, allowing measurement of the radiation of large-size objects at higher frequencies and with a reduced number of probes.

A yet further objective of the present is to propose a device, for the relative positioning of a probe network and object under test, that is easy to implement and is adapted for use irrespective of the form of the probe network of the measuring device.

These objectives are reached according to the invention by means of a device for the relative positioning of a network of electromagnetic probes and object under test, characterized in that it comprises means for relative movement of the object under test and of the network of electromagnetic probes over at least two degrees of freedom, this relative movement allowing the measurement points to be multiplied over these two degrees of freedom, so as to produce spatial oversampling by means of the probe network when measuring a radiated field around or in front of the object.

Advantageously, the means for relative movement of the object under test and of the network of electromagnetic probes have a third degree of freedom which can be used to complete the oversampling or present the object under different facets.

In one particular embodiment, the device comprises sliding means intended to move either the object or the probe network in at least one sliding direction, and relative rotating means for the object under test and probe network about a main rotation axis.

The rotating means may be separate from the sliding means.

As a variant, provision may be made so that the sliding means and rotating means are arranged one on the other.

Other characteristics, objectives and advantages of the invention will become apparent on reading the following detailed description which is solely illustrative and is non-limiting, and is to be read in connection with the appended drawings in which:

FIG. 2 is a schematic illustration of one possible embodiment of the device for the relative positioning of the network of electromagnetic probes and object under test in FIG. 1;

FIGS. 3a and 3b, 4 and 5 are schematic illustrations of other possible embodiments of the device for relative positioning of the network of electromagnetic probes and the object under test in FIG. 1.

Figure 1:
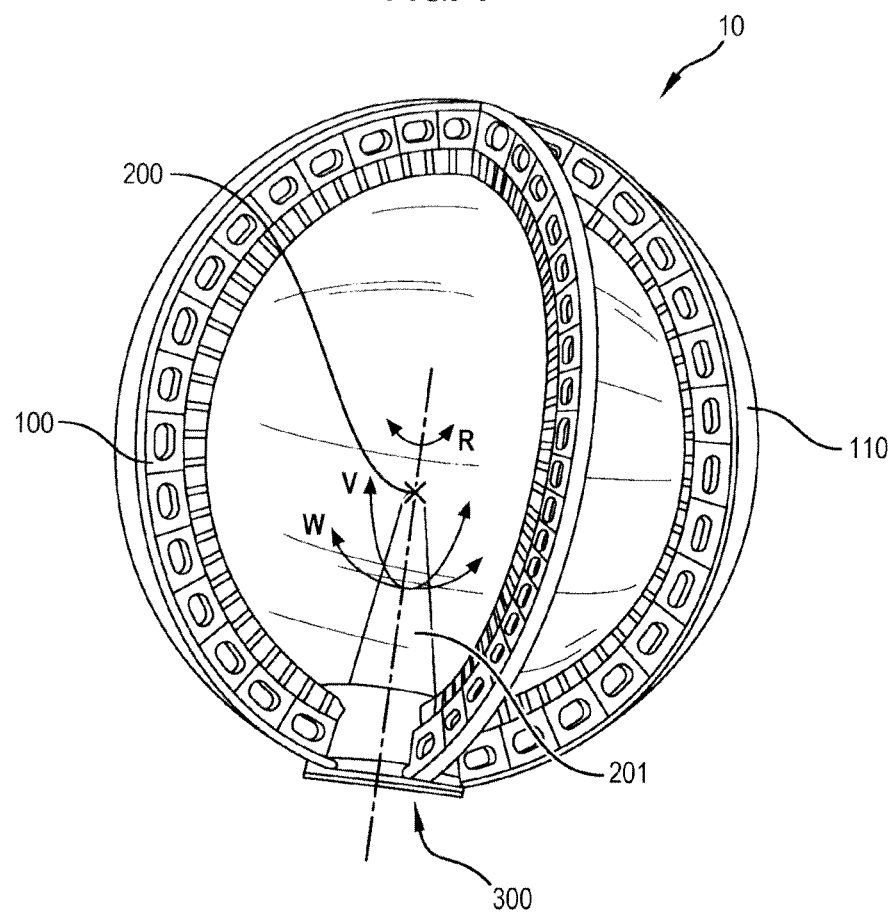
FIG. 1 illustrates a device for determining the electromagnetic radiation of an object under test, comprising a device for the relative positioning of a network of electromagnetic probes and an object under test.

FIG. 1 shows a measuring device 10 mainly comprising a network of measuring antennas 100 to determine the radiation diagram of an object under test 200 schematized by a cross.

In addition a device 300 is provided for the relative positioning of the measuring antenna network 100 and the object under test 200.

The network 100 of measuring antennas also called electromagnetic probes is distributed over a sphere 110.

It is to be noted that a network 100 is defined as a series of n measuring antennas, n being equal to or greater than 2.

Preferably this network 100, on the sphere 110, combines several series of electromagnetic probes operating at different frequencies to broaden the operating band of the measuring device 10.

As non-limiting example, mention may be made of a network 100 combining two series of electromagnetic probes so as to perform measurements covering the 0.4 GHz to 18 GHz frequency band.

A support 201 is also shown intended to carry the object 200 whose electromagnetic behaviour it is sought to determine.

This support 201 is essentially a mast which extends from the positioning device 300 as far as the vicinity of the geometric centre of the sphere 110.

The object 200 is placed on the support to define its azimuth position and allow placing thereof in the region of the centre of the sphere 110 of the network of electromagnetic probes 100.

In FIG. 1, the spherical network of electromagnetic probes is fixed, whilst the mast 201 is placed on the positioning device 300 allowing relative movement thereof in relation to the spherical net 100.

1. Device for relative positioning of the spherical network of electromagnetic probes and the object under test.

This device 300 for the relative positioning of the spherical network of electromagnetic probes and the object under test 200 is illustrated in more detail in FIGS. 2 3, 4 and 5.

In the variant shown FIG. 2, this device comprises a circular arc guide rail 301, which allows relative sliding of the object under test 200 and of the probe network 100, intended to move either the object 200 or the probe network 100 in at least one sliding direction belonging to a diametric plane of the probe network 100. This circular arc guide rail 301 also carries rotating means 320, in particular with a support 321, which are optionally able to be separated from the rail 301 and pivot axially on themselves and thereby allow relative rotation of the object under test 200 and probe network 100 about a main rotation axis perpendicular to the direction of sliding.

The sliding means 301 which form the guiding arc are advantageously chosen so that they offset the object under test 200 from the spherical probe network 100 at an angle to each other.

More precisely, as illustrated FIG. 1, they allow the object under test 200 to be caused to slide over a diametric plane of the spherical probe network 100 about the geometric centre of the sphere.

The guide rail 301 comprises two parallel guide walls 311, 312 extending in the direction of sliding. These walls 311, 312 form guiding means 310 and are arranged on a base 313 intended to maintain the spacing and incline of the walls 311, 312.

Provision is also made for a sliding pallet 314 which carries the rotating means 320 and allows the object under test 200 to be moved along the guiding means 310 and to fix it in an adjustable position along these means.

These guide walls 311, 312 have a curvilinear profile adapted to allow angular movement of the object under test 200 about the geometric centre of the sphere.

In one variant of embodiment of the guiding means, he walls 311 and 312 can advantageously be replaced by a concave sliding surface receiving a convex surface carrying the sliding pallet 314.

The sliding means further comprise means 315 capable of driving the sliding pallet 314, carrying the object under test 200, along the guide rail 301 in the direction of sliding towards the desired position.

For example, these driving means 315 may comprise gear, rack, endless screw, notched belt or other systems associated with electric motorization to move the object under test 200 along the guide walls 311, 312.

Also, the means 320 for relative rotation of the object under test 200 and the probe network 100 are arranged on the sliding pallet 314 and are freely rotatable relative to said pallet 314.

The rotating means 320 for relative rotation of the object under test 200 and probe network 100 comprise a support 321 intended to receive the object under test 200, and means capable of driving said support 321 about its main axis of rotation.

This support 321 therefore drives the object under test 200 during measurements by the network of electromagnetic probes 100, so that it describes a rotation about itself. Driving means 322 of gear, notched belt, endless crew, squirrel cage or other type are provided for this purpose at the rotating means 320.

As will have been understood, in the variant of embodiment just described, provision may be made so that the object under test 200 is mobile and placed on the positioning device 300, whilst the probe network 100 remains fixed. The reverse is also possible, the network possibly being mobile and positioned by means of device 300, whilst the object under test is in fixed position.

In one variant of embodiment of the device, the relative rotating means 320 for the object under test 200 and probe network 100 may be separate from the sliding pallet 314 and positioned on a fixed base placed beside the sliding means 301 or underneath the sliding means. If the rotating means 320 are placed on a fixed base underneath the sliding means 301, the pallet 314 is adapted so that it gives clearance to the support 321, intended to receive the object under test 200, together with means capable of driving said support 321 about its main axis of rotation. In this variant of embodiment, the main axis of rotation of the support 321 for the object under test 200 remains fixed whilst the sphere 110 of the probe network 100 is mounted on the sliding pallet 314 and is mobile enabling it to move relatively in relation to the object under test 200. The reverse is also possible, the object under test 200 being mounted on the sliding pallet, whilst the probe network is mounted rotatably about an independent axis 301 (i.e. separate).

Figure 3A:
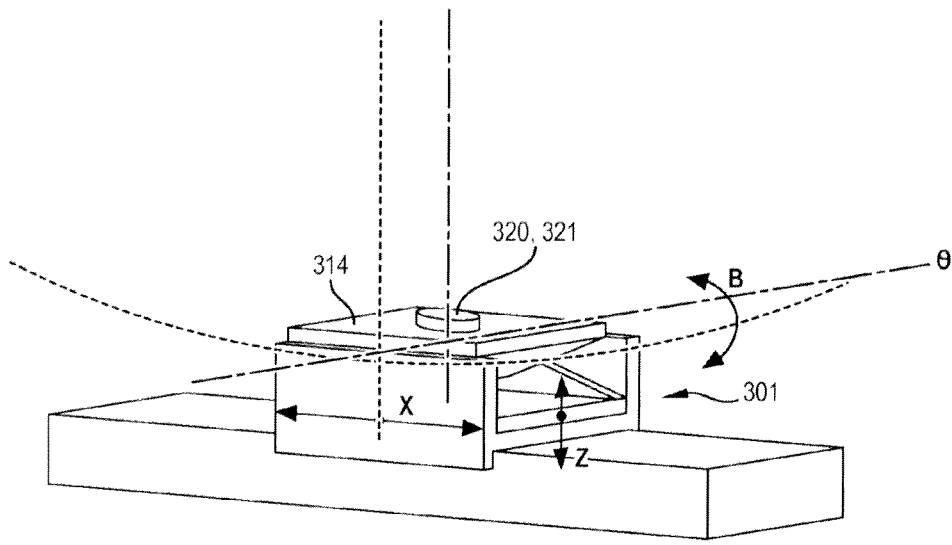
Figure 3B:
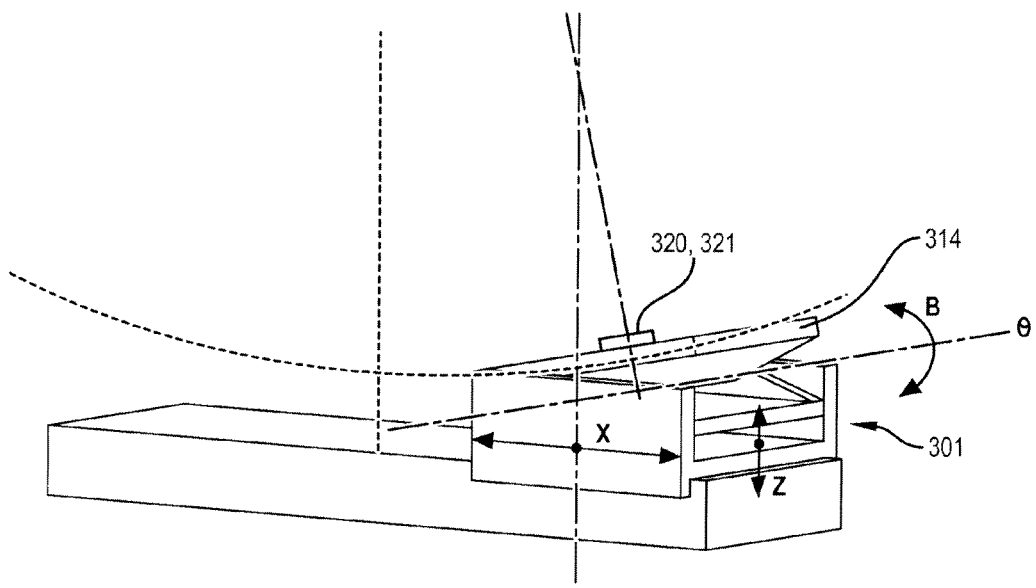

Also, according to another variant of embodiment of the device 300 and such as illustrated FIGS. 3a and 3b, the relative sliding (and/or rotating) means 301 for the object under test 200 and the probe network 100 can be formed by 3 independent mechanical movements (sets of cylinders and/or electric motors): translation along axis X, second translation along axis Z and rotation about axis θ. The combination of translations along axes X and Z will allow curvilinear travel equivalent to the travel with the sliding means 301 in FIG. 2, whilst rotation about axis θ will allow maintaining of the orientation of the pallet 314 equipped with its rotating means 320, the rotation axis of the support 321 remaining perpendicular to the curvilinear travel of sliding. This variant of embodiment has the advantage of being adaptable to any sphere radius 110 of the probe network 100 and offers the possibility of digitally programming the curvilinear travel of the sliding movement. It also allows real time correction of the trajectory by means of laser for example, measuring the positioning of the mast 201 or object under test 200 in real time.

Additionally, according to another variant of embodiment of the device 300, the relative sliding means 301 for the object under test 200 and probe network 100 are designed to move either one of the object 200 or probe network 100 in two perpendicular sliding directions belonging to one or more planes of the probe network 100 on which the relative rotation means 320 for the object under test 200 and probe network 100 are arranged, about a main axis of rotation perpendicular to the sliding directions.

As illustrated FIG. 4, the sliding means 301 may then assume the form of first guiding means 310 defined by the two parallel guiding walls 311, 312 extending in a first direction of sliding on which the first sliding pallet 314 is arranged, and second guiding means 330 (walls 331, 332) extending in a second direction of sliding perpendicular to the first and on which a second sliding pallet 334 is arranged.

The first and second assemblies are similar to the sliding means 301 described with reference to FIG. 2.

In a further embodiment, first and second assemblies are combined by juxtaposition that are similar to the sliding means 301 described with reference to FIG. 3.

The arrangement of FIG. 4 is specified below.

On the first sliding pallet 314, the second rail 330 is positioned. Therefore the first sliding pallet 314 of the first assembly allows movement of the second assembly in the first direction of sliding and fixing thereof in an adjustable position along the guide means 310.

These sliding means 301 are adapted to allow two perpendicular angular movements of the object under test 200 so that it describes the contour of a sphere centred on the geometric centre of the spherical network of electromagnetic probes 100.

On the second sliding pallet 334, the support for the rotating means 320 is attached allowing rotation of the object under test 200 relative to the sphere of the probe network 100.

Figure 5:
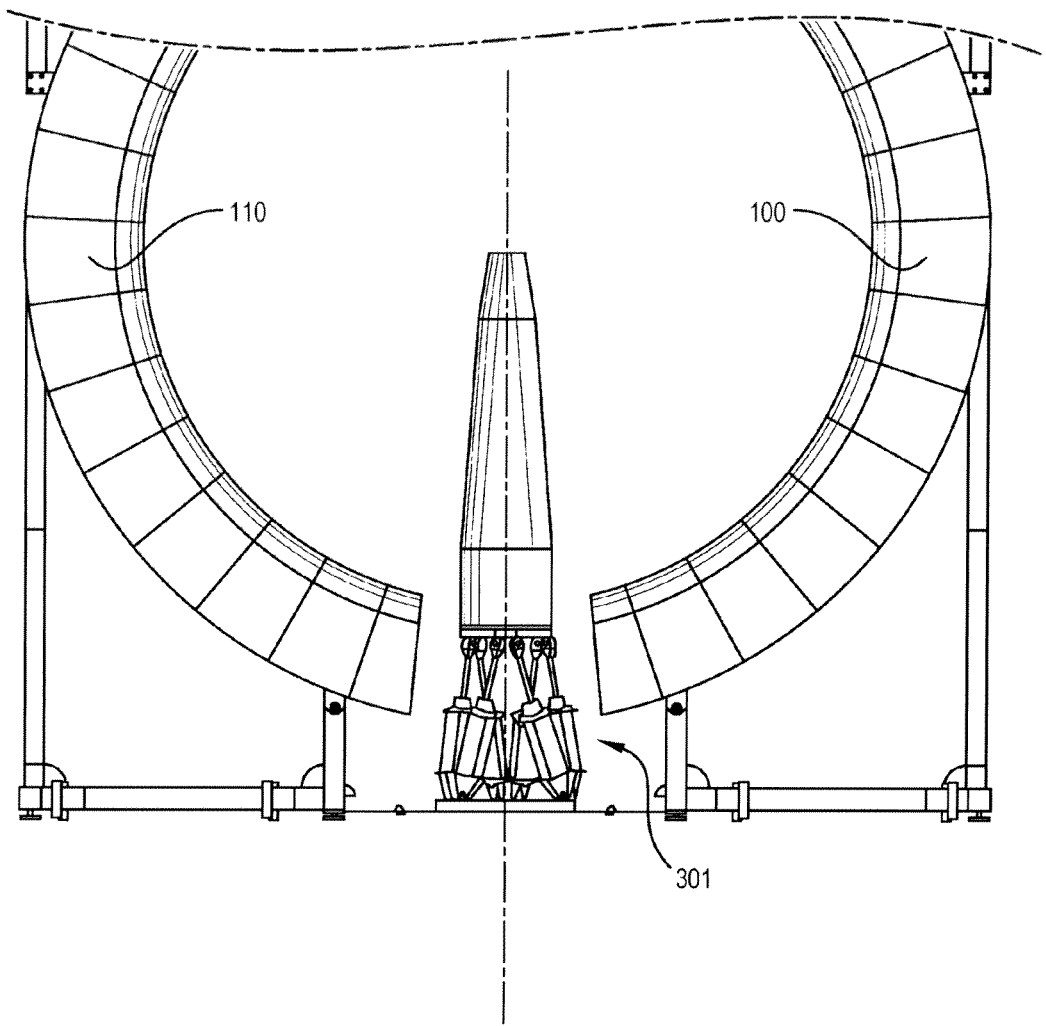

In addition, according to another variant of embodiment of the device 300 such as illustrated FIG. 5, the relative sliding means 301 for the object under test 200 and probe network 100 can be formed of an assembly of 6 mechanical cylinders, also called a hexapod, allowing curvilinear travel equivalent to that achieved with the sliding means 301 in FIG. 4 whilst maintaining the orientation of the axis of the rotating means 320 perpendicular to the curvilinear travel of sliding. This variant of embodiment has the advantage of being fully reconfigurable in relation to any radius of the sphere 110 of the probe network 100. In addition, this solution also allows easy adjusting of the height of the mast 201 on which the object under test is placed. In addition, it allows multiple variants of curvilinear travel and offers the possibility of digitally programming the curvilinear sliding trajectories and the ability to perform real-time correction of the trajectory by means of laser for example, through real-time measurement of the position of the mast 201 or object under test 200.

Additionally, in one variant of embodiment of the devices 300 shown FIGS. 1 to 4, provision is made for the probe network 100 to be mobile and placed on the positioning device 300 not integrating the rotating means 320, whilst the object under test 200 is placed on the support 321 on the rotating means 320 detached from the sliding means 301 and thereby maintains a fixed main axis of rotation.

In one variant of embodiment of the device 300 shown FIGS. 1 to 4, provision is made for the object under test 200 to be mobile and placed on the positioning device 300 not integrating the rotating means 320, whilst the probe network 100 is placed on the support 321 on the rotating means 320 which are detached from the sliding means 301 and it thereby maintains a fixed main axis of rotation.

2. Three-Dimensional Oversampling

The device 300 for the relative positioning of the object under test 200 and network of electromagnetic probes 100 advantageously allows three-dimensional oversampling of radiated field measurements.

Each sliding movement on the rails 310, 330 advantageously allows multiplication of the measurement points of radiation around the object, and thereby allows increased angle sampling.

Further to sliding of the object under test on the rails 310, 330 from an initial position to a final position, it is possible to offset the network of electromagnetic probes 100 at an angle from the object under test 200, or conversely, and thereby scan several relative positions of the probe network 100 in relation to the object under test 200.

Therefore for each plane of radiation measurement, it is possible to obtain several series of consecutive measurement points corresponding to the different relative angles of offset between the network of electromagnetic probes 100 and the object under test 200.

With a spherical network of electromagnetic probes 100, these relative angle offsets of the network of electromagnetic probes 100 and object under test 200 are smaller than the angular pitch of the probe network 100

The sliding means 301 previously described, to allow two perpendicular angular movements of the object under test 200 and of the network of electromagnetic probes 100, offer the possibility of multiplying the radiated field measurement points in spherical coordinates with a spherical network of electromagnetic probes 100 and to obtain oversampling in elevation.

The rotating means 320 about a main axis, perpendicular to the directions of sliding, allow multiplication of the measurement points in the azimuth plane or a plane parallel thereto.

In this manner, oversampling in azimuth comes to be combined with oversampling in elevation, offering the possibility to multiply the number of sampled measurement points in three dimensions over the entire measurement sphere surrounding the object under test 200.

3. Other Geometries

The invention has been described with reference to spherical probe networks. It evidently applies to any other configuration of probe network and notably linear or planar networks, networks supported by a circular arch or portion of circular arch, or networks supported by a spherical or cylindrical cap.

For example, with a linear probe network, a device 300 is provided to position the probe network 100 or object under test 200, which comprises sliding means 301 intended to allow linear sliding for radiated field measurements in planar coordinates.

These sliding means 301 are advantageously chosen to offset the probe network 100 and object under test 200 from each other by an offset that is greater or smaller than the pitch of the probe network 100, and to allow measurements in several relative positions of the probe network 100 and object under test 200.

The guiding means 310 may then assume the form of two rails 311, 312 of rectilinear profile on which the positioning pallet 314 is transversely positioned and is capable of receiving and fixing the object under test 200 or network of electromagnetic probes 100 in an adjustable position along these rails.

The linear sliding movement of the network of electromagnetic probes 100 on the rails 311, 312, advantageously allows the measurement points to be multiplied in a plane of radiation measurement, but also allows widening of the covered geometric area of measurement for the object under test 200.

The sliding movement with an offset greater than the pitch of the probe network 100 effectively allows a different geometric area to be covered for the object under test 200, in a plane of radiation measurement, compared with the one previously described before sliding.

In one example of embodiment, the device 300 positioning the probe network 100 is translated perpendicular to the probe network 100 in front of the object under test 200 placed on fixed support 201, to carry out measurements over a plane in front of the object under test.

In another example of embodiment, the device 300 positioning the probe network 100 is placed in front of the object under test 200, itself fixed on a mast 201 mounted on a support 321 driven by rotation means 320 rotating the object under test in relation to the probe network about a rotation axis parallel to the probe network, to perform measurements on a cylinder surrounding the object under test.

In another example of embodiment, the device assembly 300 positioning the probe network 100 undergoes rotation by means of rotating means 320 in front of the object under test 200 placed on a fixed support 201, to carry out measurements on a disc in polar geometry in front of the object under test.

In another variant of embodiment, a probe network 100 is provided distributed over a planar support.

The sliding means 301 are then similar to the sliding means described with reference to FIG. 4 except for the profile shape of the rails of the two assemblies used.

The pair of rails for each assembly has a rectilinear profile allowing the sliding means 301 to move the probe network 100 or object under test 200 linearly in the two perpendicular directions forming the plane of the probe network.

The preceding description can evidently be transposed to the case in which measurements are in spherical or cylindrical geometry.

To conclude, the person skilled in the art will appreciate a device 300 for relative positioning of the probe network 100 and object under test 200, allowing multiplication of points of measurement irrespective of the form of probe network 100, and hence with respect to a spherical probe network 100 the opportunity to perform three-dimensional oversampling over an entire measurement sphere surrounding the object under test 200.

The person skilled in the art will also appreciate a device 3000 for the relative positioning of the probe network and object under test 200 allowing the coverage of a larger geometric area of measurement for the object under 200 in comparison with the probe network 100 used.

The invention claimed is:

1. Device (300) for the relative positioning of a network of electromagnetic probes (100) and an object under test (200), comprising means (301) for the relative movement of the object under test (200) and network of electromagnetic probes (100) over at least two degrees of freedom,
    said means (301) including sliding means (301) which moves either the object (200) or the probe network (100),
    the sliding means (301) comprising a first guide assembly extending in a first sliding direction on which a first sliding pallet (314) is arranged, and a second guide assembly extending in a second sliding direction perpendicular to the first on which a second sliding pallet (334) is arranged,
    the relative movement allowing multiplication of the measurement points in these two degrees of freedom, to perform spatial oversampling by means of the probe network (100) when measuring the radiated field around or in front of the object (200).

2. The device according to claim 1, wherein the means (301) for relative movement of the object under test (200) and of the network of electromagnetic probes (100) have a third degree of freedom which is used to complete oversampling or to present the object under different facets.

3. The device according to claim 1, comprising means (320) for relative rotation of the object under test (200) and probe network (100) about a main axis of rotation.

4. The device according to claim 3, wherein the rotating means (320) are separate from the sliding means (301).

5. The device according to claim 3, wherein the sliding means (301) and the rotating means (320) are superimposed over each other.

6. The device according to claim 1, wherein the second sliding pallet (314) receives either the object under test (200) or the network of electromagnetic probes (100).

7. The device according to claim 1,
    further comprising rotating means for rotation of the object under test about an axis perpendicular to the first and second guide assemblies.

8. The device according to claim 1, comprising a set of cylinders and/or electric motors configured to achieve the sliding and/or rotation movements.

9. The device according to claim 8, comprising means for digital programming of the sliding and/or rotating movements.

10. The device according to claim 8, comprising a set of cylinders with hexapod arrangement.

11. The device according to claim 10, comprising detection means of optical type for real-time correction of movement.

12. The device according to claim 10, wherein the hexapod is arranged for relative sliding of the object under test and the network of electromagnetic probes according to a curvilinear travel, the device further comprising rotating means for relative rotation of the object under test and the network of electromagnetic probes on a perpendicular axis to the curvilinear travel of sliding.

13. A device according to claim 12, further comprising means for digital programming of at least one of the sliding and rotating movements.

14. The device according to claim 1, wherein the first and second guide assemblies have a curvilinear profile, so as to allow angular movement of the object under test about the geometric centre of a sphere made by the probe network.

15. The device according to claim 14, further comprising rotating means allowing rotation of the object under test relative to the sphere of probe network.

16. The device according to claim 15, comprising
means for relative rotation of the object under test and probe network about a main axis of rotation,
a set of cylinders and/or electric motors capable together of achieving the sliding and/or rotation movements, said set of cylinders being arranged according to an hexapod, and
means for digital programming of the sliding and/or rotation movements.

17. Device for determining at least one characteristic of electromagnetic radiation of an object under test (200) comprising
a network of electromagnetic probes (100),
a device (300) for relative positioning of the object under test (200) and said probe network (100),
a device (300) for relative positioning of the object under test (200) and said probe network (100),
means (301) for the relative movement of the object under test (200) and network of electromagnetic probes (100) over at least two degrees of freedom,
said means(301) including sliding means (301) which moves either the object (200) or the probe network (100),
the sliding means (301) comprising a first guide assembly extending in a first sliding direction on which a first sliding pallet (314) is arranged, and a second guide assembly extending in a second sliding direction perpendicular to the first on which a second sliding pallet (334) is arranged,
the relative movement allowing multiplication of the measurement points in these two degrees of freedom, to perform spatial oversampling by means of the probe network (100) when measuring the radiated field around or in front of the object (200).

18. The device according to claim 17, wherein the network of electromagnetic probes (100) is a probe network of linear or planar shape, circuit arch or portion of circular arch shape, or of spherical cap or cylindrical cap shape.

19. The device according to claim 17, wherein the means (301) for relative movement of the object under test (200) and of the network of electromagnetic probes (100) have a third degree of freedom which is used to complete oversampling or to present the object under different facets.

20. The device according to claim 17, wherein the first and second guide assemblies have a curvilinear profile, so as to allow angular movement of the object under test about the geometric centre of a sphere made by the probe network.

21. The device of claim 20, further comprising means for relative rotation of the object under test and probe network about a main axis of rotation.

* * * * *